United States Patent
Tsutsumi

(10) Patent No.: US 8,113,699 B2
(45) Date of Patent: Feb. 14, 2012

(54) LIGHT SOURCE MODULE AND VEHICULAR LAMP

(75) Inventor: Yasuaki Tsutsumi, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 425 days.

(21) Appl. No.: 12/405,116

(22) Filed: Mar. 16, 2009

(65) Prior Publication Data
US 2009/0237938 A1    Sep. 24, 2009

(30) Foreign Application Priority Data

Mar. 21, 2008  (JP) ................................. 2008-073046

(51) Int. Cl.
*B60Q 1/00* (2006.01)
(52) U.S. Cl. ........ 362/538; 362/539; 362/548; 362/545; 257/99; 257/773
(58) Field of Classification Search .................. 362/538, 362/539, 545, 548, 549, 520, 521, 438, 84; 313/498, 113, 318.11; 257/98, 99, 690, 700, 257/731, 773; 438/110
See application file for complete search history.

(56) References Cited

U.S. PATENT DOCUMENTS

| | | | | |
|---|---|---|---|---|
| 6,496,285 B1 * | 12/2002 | Fujimoto et al. | ............. | 358/475 |
| 7,078,729 B2 * | 7/2006 | Suzuki et al. | ................... | 257/79 |
| 7,290,913 B2 * | 11/2007 | Watanabe et al. | ............. | 362/545 |
| 7,550,319 B2 * | 6/2009 | Wang et al. | ................... | 438/125 |
| 7,665,872 B2 * | 2/2010 | Nakabayashi | ................ | 362/545 |
| 7,750,458 B2 * | 7/2010 | Takeda et al. | ................. | 257/690 |
| 2007/0114556 A1 * | 5/2007 | Ogihara et al. | ................. | 257/99 |

FOREIGN PATENT DOCUMENTS

JP        2005-032661       2/2005

OTHER PUBLICATIONS

English abstract of JP2005032661 published Feb. 3, 2005, esp@cenet database, 1 page.

* cited by examiner

*Primary Examiner* — Thomas Sember
(74) *Attorney, Agent, or Firm* — Osha • Liang LLP

(57) ABSTRACT

A light source module includes a circuit board on which a circuit pattern is formed; a semiconductor light emitting element; an electrode pad; and a connecting body. The semiconductor light emitting element includes a first surface formed into an oblong shape, and a second surface positioned facing opposite the first surface. The second surface is connected with a second part of the circuit pattern. The electrode pad is provided on the first surface of the semiconductor light emitting element and includes a connecting portion. The connecting body is connected with the connecting portion of the electrode pad and a first part of the circuit pattern. The electrode pad is provided on a portion of the semiconductor light emitting element that includes one end portion of the first surface. The connecting portion of the electrode pad is provided at a position in one of a continuous and spaced manner in the lengthwise direction of the electrode pad.

11 Claims, 9 Drawing Sheets

LIGHT SOURCE MODULE AND VEHICULAR LAMP

BACKGROUND OF INVENTION

1. Field of the Invention

The present invention relates to a light source module and a vehicular headlamp. More specifically, the present invention relates to increasing brightness by connecting a connecting body with an electrode pad provided on an end portion of a semiconductor light emitting element.

2. Related Art

A light source module exists that uses a semiconductor light emitting element such as a light emitting diode (LED) as a light source. Such a light source module is provided in a vehicular lamp that radiates light emitted from the light source as illumination light.

One face of the semiconductor light emitting element is provided with an electrode pad that is connected with a circuit pattern formed on a circuit board.

In past light source modules in vehicular lamps, the electrode pad provided on one face of the semiconductor light emitting element is connected with the circuit pattern by one wire (see Patent Document 1, as an example).

[Patent Document 1] Japanese Patent Application Laid-Open (Kokai) No. 2005-32661

SUMMARY OF INVENTION

However, a sufficient amount of luminous flux must be secured from light emitted from the light source to increase the brightness of vehicular lamps, both from the standpoint of headlamps or the like to improve safety and traveling performance during vehicle running, and from the standpoint of marker lamps or the like to improve external visibility and so forth.

Such increased brightness is accomplished in the above-mentioned light source module by improving the heat radiation performance in order to suppress a temperature increase caused by heat generated while the light source is driving, and also by increasing the power supplied to the light source (a large power supply).

In cases where a semiconductor light emitting element is used as the light source, the amount of light emitted from the semiconductor light emitting element is small as compared to a halogen lamp and a discharge lamp. Thus, the need to improve the heat radiation performance and supply more power is particularly critical for a light source module that has a semiconductor light emitting element.

However, in the light source module described in Patent Document 1, the electrode pad provided on one face of the semiconductor light emitting element is connected with the circuit pattern on the circuit board by one wire. Therefore, it is difficult to achieve sufficient heat radiation performance and, because the amount of power supplied to the semiconductor light emitting element is small, it is difficult to secure a sufficient amount of luminous flux from emitted light to increase brightness.

One or more embodiments of the light source module and the vehicular lamp of the present invention increase brightness by securing a sufficient amount of luminous flux from emitted light.

In one or more embodiments, a light source module includes: a circuit board on which a circuit pattern is formed having a first part and a second part; a semiconductor light emitting element that has a first surface formed into an oblong shape and a second surface positioned facing opposite the first surface, the second surface being connected with the second part of the circuit pattern; an electrode pad that is provided on the first surface of the semiconductor light emitting element and has a connecting portion; and a connecting body that is connected with the connecting portion of the electrode pad and the first part of the circuit pattern, wherein the electrode pad is provided on a portion of the semiconductor light emitting element that includes one end portion of the first surface, and the connecting portion of the electrode pad is provided at a position in one of a continuous and spaced manner in the lengthwise direction of the electrode pad.

In one or more embodiments, a vehicular lamp has a light source module that includes: a circuit board on which a circuit pattern is formed having a first part and a second part; a semiconductor light emitting element that has a first surface formed into an oblong shape and a second surface positioned facing opposite the first surface, the second surface being connected with the second part of the circuit pattern; an electrode pad that is provided on the first surface of the semiconductor light emitting element and has a connecting portion; and a connecting body that is connected with the connecting portion of the electrode pad and the first part of the circuit pattern, wherein the electrode pad is provided on a portion of the semiconductor light emitting element that includes one end portion of the first surface, and the connecting portion of the electrode pad is provided at a position in one of a continuous and spaced manner in the lengthwise direction of the electrode pad.

Accordingly, a connection area of the connecting body is large with respect to the electrode pad in the light source module and the vehicular lamp.

A light source module in accordance with one or more embodiments of the present invention is characterized by including: a circuit board on which a circuit pattern is formed having a first part and a second part; a semiconductor light emitting element that has a first surface formed into an oblong shape and a second surface positioned facing opposite the first surface, the second surface being connected with the second part of the circuit pattern; an electrode pad that is provided on the first surface of the semiconductor light emitting element and has a connecting portion; and a connecting body that is connected with the connecting portion of the electrode pad and the first part of the circuit pattern, wherein the electrode pad is provided on a portion of the semiconductor light emitting element that includes one end portion of the first surface, and the connecting portion of the electrode pad is provided at a position in one of a continuous and spaced manner in the lengthwise direction of the electrode pad.

Therefore, a connection area between the connecting body and the electrode pad is large, which leads to improved heat radiation performance. Furthermore, a large amount of power can be supplied to the semiconductor light emitting element, which makes it possible to improve brightness by securing a sufficient amount of luminous flux from light emitted from the semiconductor light emitting element.

According to the invention in accordance with one or more embodiments, a connecting sheet formed by a metallic material is used as the connecting body and one end portion of the connecting sheet is connected with the connecting portion of the electrode pad. A sufficient connection area between the connecting body and the electrode pad can thus be secured, thereby improving brightness.

According to the invention in accordance with one or more embodiments, a side edge extending in the lengthwise direction of the electrode pad is formed as a cut-off line forming portion that forms a cut-off line of a light distribution pattern, which is generated by light emitted from the semiconductor light emitting element. There is consequently no need for a light-blocking member such as a shade in order to generate the light distribution pattern. This reduction in the number of parts can also lower manufacturing costs.

According to the invention in accordance with one or more embodiments, the cut-off line forming portion of the electrode pad is divided in two in the lengthwise direction so as to form a first line forming portion and a second line forming portion, respectively, and the first line forming portion and the second line forming portion are formed at different positions in a direction orthogonal to the lengthwise direction of the electrode pad. Therefore, a desired light distribution pattern can be formed by the first line forming portion and the second line forming portion of the electrode pad.

A vehicular lamp in accordance with one or more embodiments of the present invention has a light source module disposed in a lamp space, and an optical member that practices a predetermined function with respect to light emitted from the light source module. The vehicular lamp is characterized in that the light source module comprises: a circuit board on which a circuit pattern is formed having a first part and a second part; a semiconductor light emitting element that has a first surface formed into an oblong shape and a second surface positioned facing opposite the first surface, the second surface being connected with the second part of the circuit pattern; an electrode pad that is provided on the first surface of the semiconductor light emitting element and has a connecting portion; and a connecting body that is connected with the connecting portion of the electrode pad and the first part of the circuit pattern, wherein the electrode pad is provided on a portion of the semiconductor light emitting element that includes one end portion of the first surface, and the connecting portion of the electrode pad is provided at a position in one of a continuous and spaced manner in the lengthwise direction of the electrode pad.

Therefore, a connection area between the connecting body and the electrode pad is large, which leads to improved heat radiation performance. Furthermore, a large amount of power can be supplied to the semiconductor light emitting element, which makes it possible to improve brightness by securing a sufficient amount of luminous flux from light emitted from the semiconductor light emitting element.

Other aspects and advantages of the invention will be apparent from the following description, the drawings and the claims.

DETAILED DESCRIPTION

Hereinafter, embodiments of a light source module and a vehicular headlamp of the present invention will be described with reference to the accompanying drawings.

Figure 1:
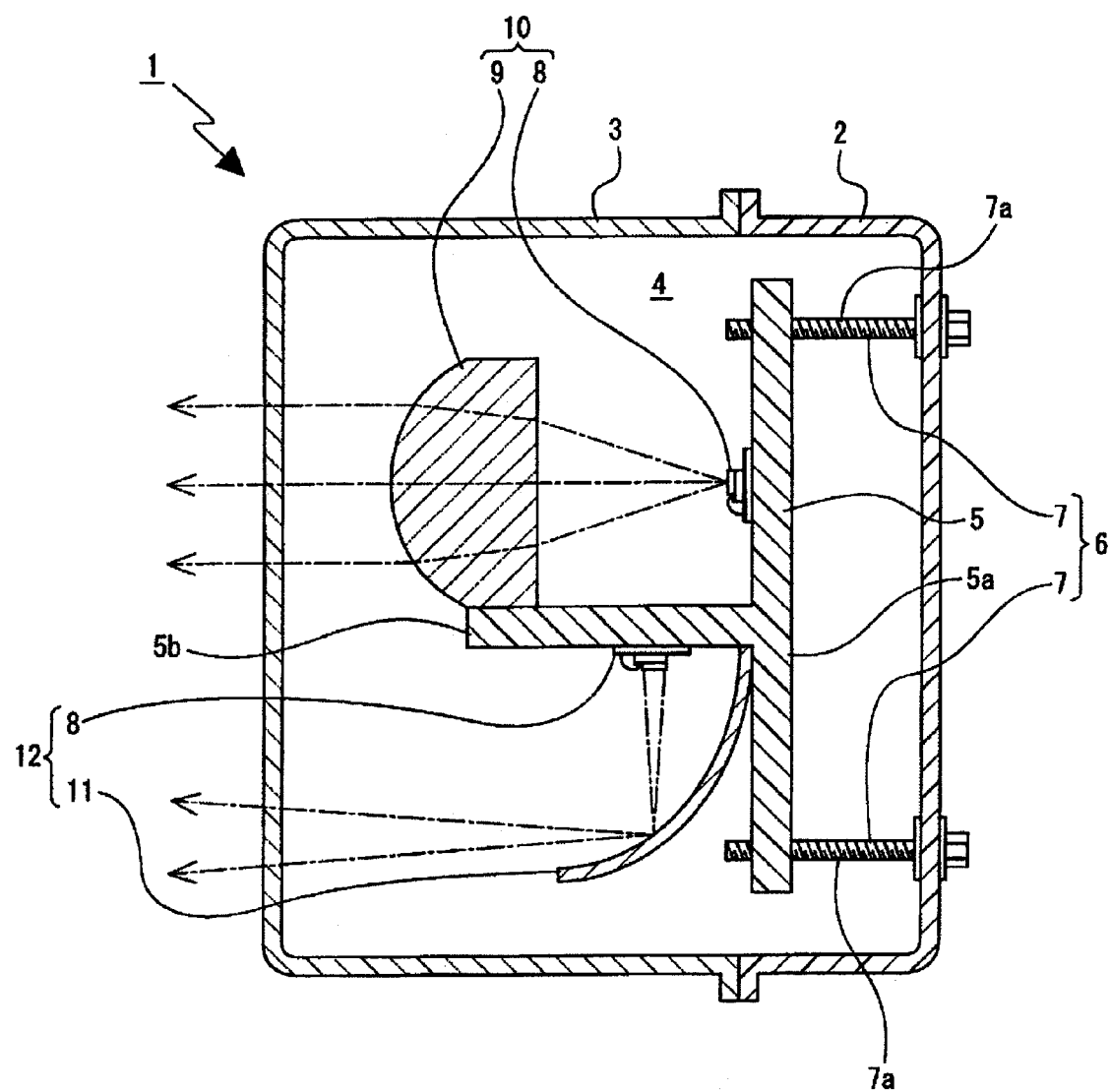
FIG. 1 depicts a best mode of the present invention, together with FIGS. 2 to 9, and is a schematic cross-sectional view of a vehicular headlamp.

A vehicular lamp 1 is, for example, a vehicular headlamp. As FIG. 1 illustrates, the vehicular lamp 1 is formed by a container-like lamp housing 2 that opens forward, a cover 3 that covers the opening of the lamp housing 2, and a lamp space 4 defined by the lamp housing 2 and the cover 3 with necessary components arranged therein.

A bracket 5 is disposed in the lamp space 4 via an optical axis adjustment mechanism 6. The bracket 5 includes a vertically extending base portion 5a and an attachment projection portion 5b that protrudes from the base portion 5a.

The optical axis adjustment mechanism 6 is, for example, an aiming adjustment mechanism. The optical axis adjustment mechanism 6 includes aiming screws 7, 7 that are vertically separated from one another and are each rotatably supported on the lamp housing 2, and also includes a pivot support portion (not shown). The aiming screws 7, 7 have threaded portions 7a, 7a that are threadedly engaged with upper and lower end portions, respectively, of the base portion 5a of the bracket 5. The pivot support portion is, for example, positioned sideward of the aiming screw 7 located on the lower side, and is connected with the lamp housing 2 and the base portion 5a of the bracket 5. Due to the pivot support portion, the bracket 5 is capable of tilting with respect to the lamp housing 2.

An aiming adjustment is performed by rotating the aiming screw 7, and using the pivot support portion as a fulcrum the bracket 5 is tilted up and down and to the right and left with respect to the lamp housing 2, whereby a radiation direction of light radiated from a light source described later is changed.

Further, regarding the bracket 5, a light source module 8 is disposed on the front surface of the base portion 5a, and a projection lens 9 supported by a lens holder (not shown) is disposed on the front end portion of the top surface of the attachment projection portion 5b. The light source module 8 and the projection lens 9 are considered structural elements of a first lamp unit 10, and the projection lens 9 functions as an optical member that projects light emitted from the light source module 8 and radiates such light forward.

In the first lamp unit 10, when light is emitted from the light source module 8, the emitted light is incident to the projection lens 9 and then projected by the projection lens 9 and radiated forward.

Further, regarding the bracket 5, another light source module 8 is disposed on the bottom surface of the attachment projection portion 5b, and a reflector 11 is attached to and disposed on the rear end portion of the bottom surface of the attachment projection portion 5b. The light source module 8 and the reflector 11 are considered structural elements of a second lamp unit 12, and the reflector 11 functions as an optical member that reflects light emitted from the light source module 8 forward.

In the second lamp unit 12, when light is emitted from the light source module 8, the emitted light is reflected by the reflector 11 and radiated forward.

Figure 2:
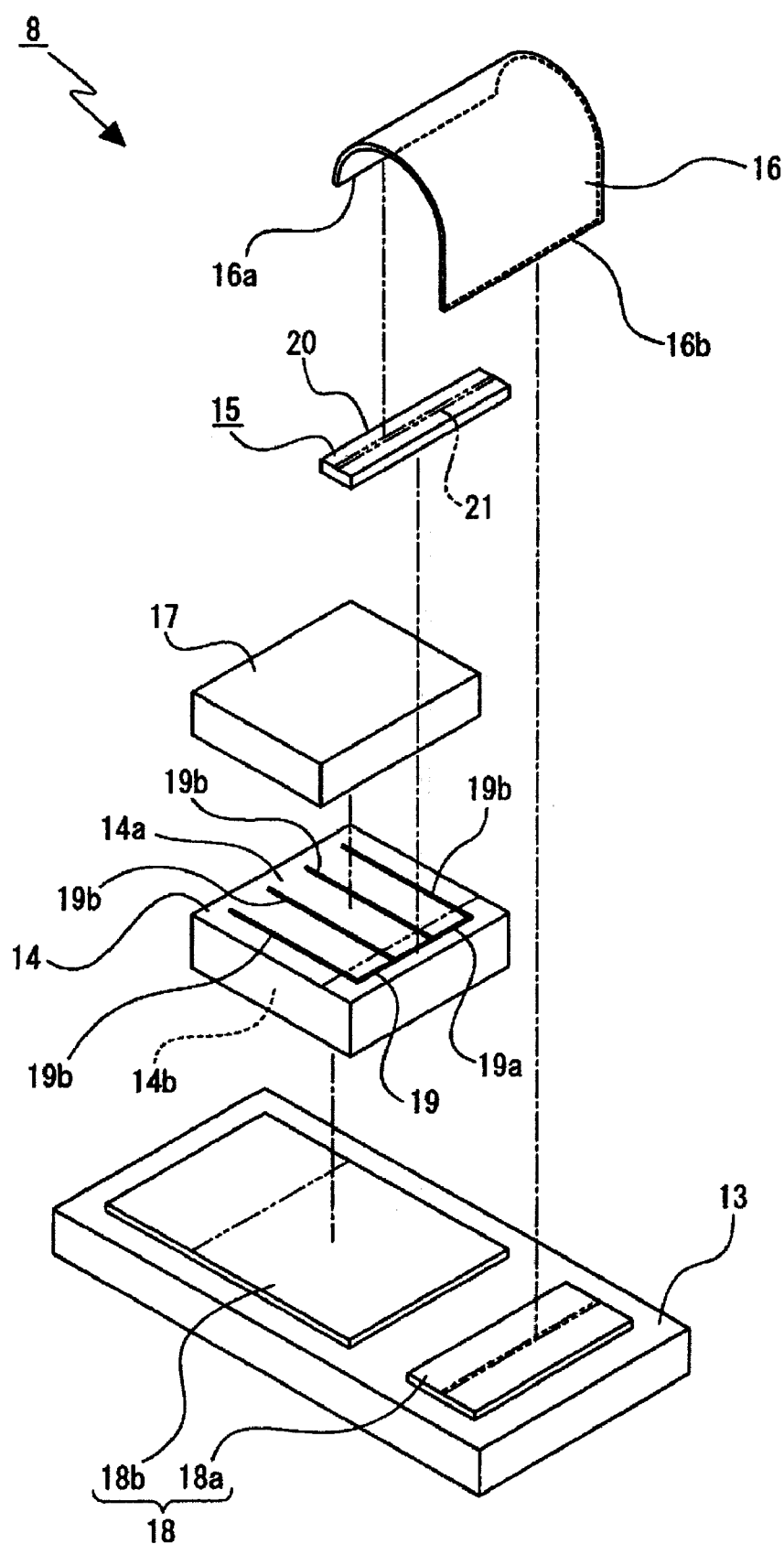
FIG. 2 is an exploded perspective view of a light source module.
Figure 3:
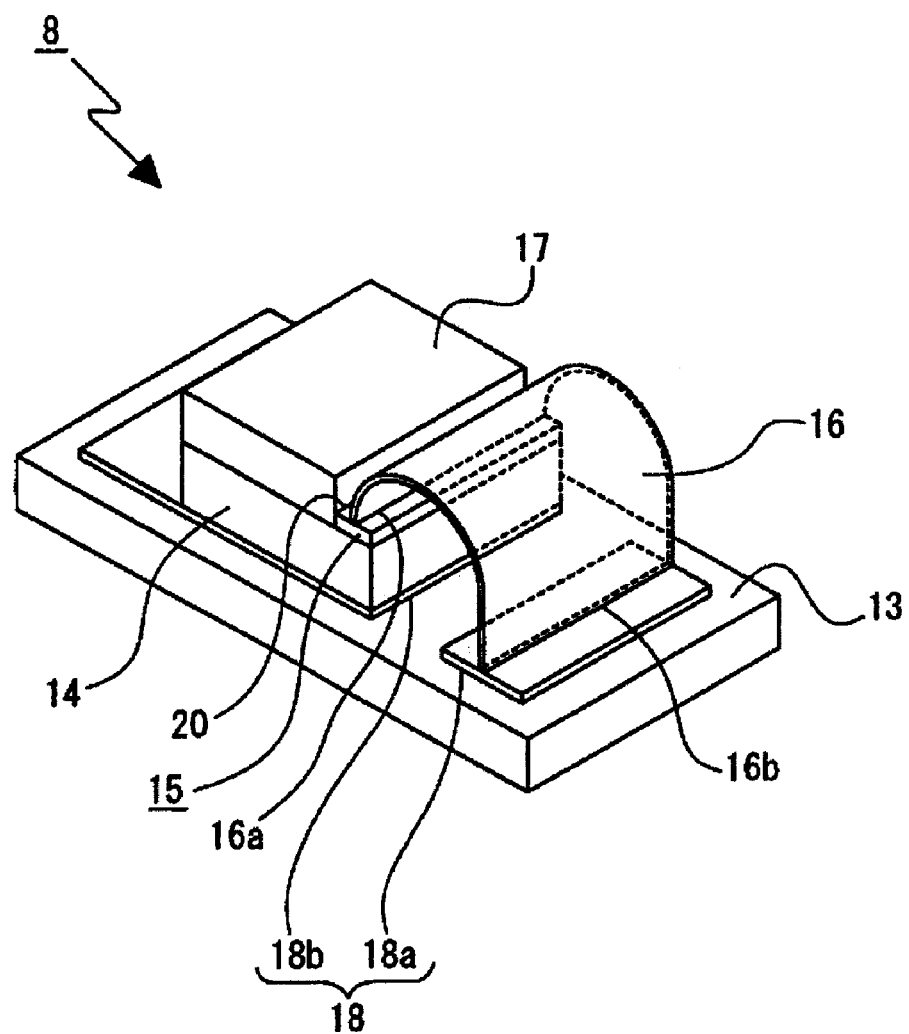
FIG. 3 is an exploded perspective view of the light source module.

The light source module 8, as illustrated in FIGS. 2 and 3, includes a circuit board 13, a semiconductor light emitting element 14, an electrode pad 15, a phosphor layer 17, and a connecting body 16.

The circuit board 13 is formed with a circuit pattern 18 on one surface, and the circuit pattern 18 includes a first part 18*a* and a second part 18*b*. The circuit board 13 is, for example, formed by an insulation material with high thermal conductivity, such as aluminum nitride. The first part 18*a* is, for example, formed as a negative electrode, and the second part 18*b* is, for example, formed as a positive electrode.

The semiconductor light emitting element 14 is, for example, a light emitting diode (LED) that emits blue light, and is formed having a cuboid configuration. One surface of the semiconductor light emitting element 14 is formed as a first surface 14*a* having an oblong shape; a surface that faces opposite the first surface 14*a* is formed as a second surface 14*b*.

A conductive pattern 19 is formed on the first surface 14*a* of the semiconductor light emitting element 14. The conductive pattern 19 is configured by a linear first part 19*a* and linear second parts 19*b*, 19*b*, . . . that are orthogonal to the first part 19*a*. The respective end portions of the second parts 19*b*, 19*b*, . . . are connected with the first part 19*a* and spaced in the lengthwise direction thereof The first part 19*a* is formed on one end portion of the first surface 14*a*, and the electrode pad 15 is provided on the first part 19*a*.

The semiconductor light emitting element 14 is connected in a state where the second surface 14*b* is in surface contact with the second part 18*b* of the circuit pattern 18.

The electrode pad 15 is provided on one end portion of the first surface 14*a* of the semiconductor light emitting element 14, and is formed into an oblong plate configuration long in one direction, for example. A side edge extending in the lengthwise direction of the electrode pad 15 is formed as a cut-off line forming portion 20 that forms a cut-off line of a light distribution pattern described later, which is generated by light emitted from the semiconductor light emitting element 14.

The top surface of the electrode pad 15 is at least partially formed as a connecting portion 21 that is connected with the connecting body 16, and the connecting portion 21 is, for example, considered a part that extends in the lengthwise direction of the electrode pad 15.

A connecting sheet formed by a conductive metallic material, for example, is used as the connecting body 16. In the connecting body 16, one end portion 16*a* is connected by a solder or the like to the connecting portion 21 of the electrode pad 15, and another end portion 16*b* is connected by a solder or the like to the first part 18*a* of the circuit pattern 18.

The phosphor layer 17 is, for example, a phosphor layer for yellow light emission, and is provided over the entire first surface 14*a* of the semiconductor light emitting element 14 except over portions where the electrode pad 15 is provided.

In the light source module 8 configured as described above, the conduction of electricity to the circuit pattern 18 formed on the circuit board 13 from a power circuit (not shown) supplies power to the semiconductor light emitting element 14, whereby light is emitted from the semiconductor light emitting element 14. The light emitted from the semiconductor light emitting element 14 is blue, but is radiated as white light due to passage through the phosphor layer 17.

It should be noted that, although the above description involves an example where blue light is emitted from the semiconductor light emitting element 14 and such emitted light is radiated as white light due to the phosphor layer 17, it is also possible, for example, to use an LED that emits ultraviolet light as the semiconductor light emitting element 14 and use a phosphor layer for RGB (red, green, blue) light emission or a phosphor layer for BY (blue, yellow) light emission as the phosphor layer 17. In such case, ultraviolet light is emitted from the semiconductor light emitting element 14, and such emitted light is radiated as white light by the phosphor layer 17.

Figure 4:
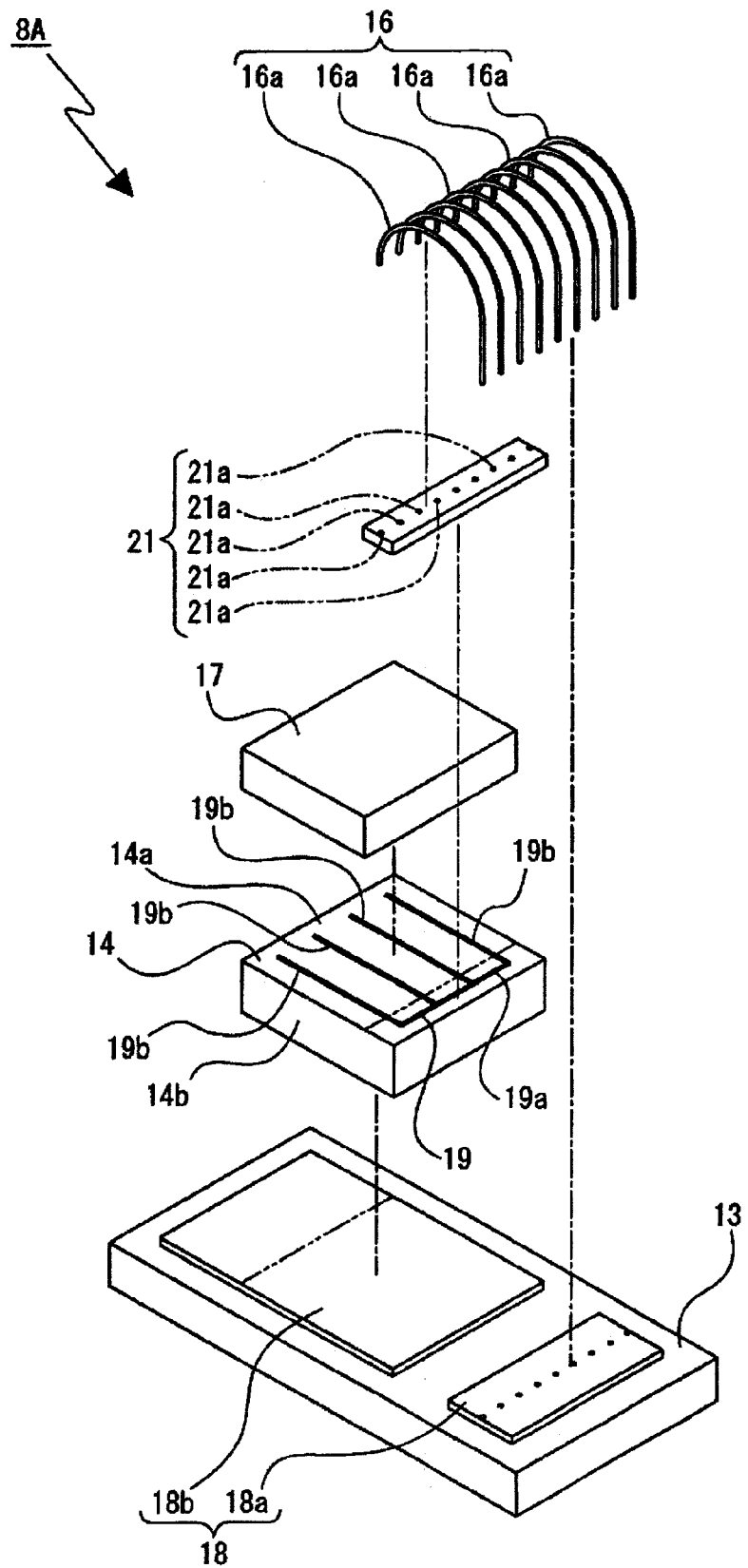
FIG. 4 is an exploded perspective view that shows the light source module using wires as a connecting body.

The above description gives an example of a connecting sheet used as the connecting body 16; however, as illustrated by a light source module 8A shown in FIG. 4 for example, a plurality of wires 16*a*, 16*a*, may also be utilized as the connecting body 16.

Regarding the light source module 8A, the plurality of wires 16*a*, 16*a*, . . . are used as the connecting body 16, wherein one end portion of the wires 16*a*, 16*a*, . . . is connected with the electrode pad 15 and spaced in the lengthwise direction thereof, while another end portion of the wires 16*a*, 16*a*, . . . is connected with the first part 18*a* of the circuit pattern 18. Accordingly, the connecting portion 21 of the electrode pad 15 is a portion where one end portion of the wires 16*a*, 16*a*, . . . is connected, and the connecting portion 21 is configured by a plurality of parts 21*a*, 21*a*, . . . spaced in the lengthwise direction of the electrode pad 15.

Figure 5:
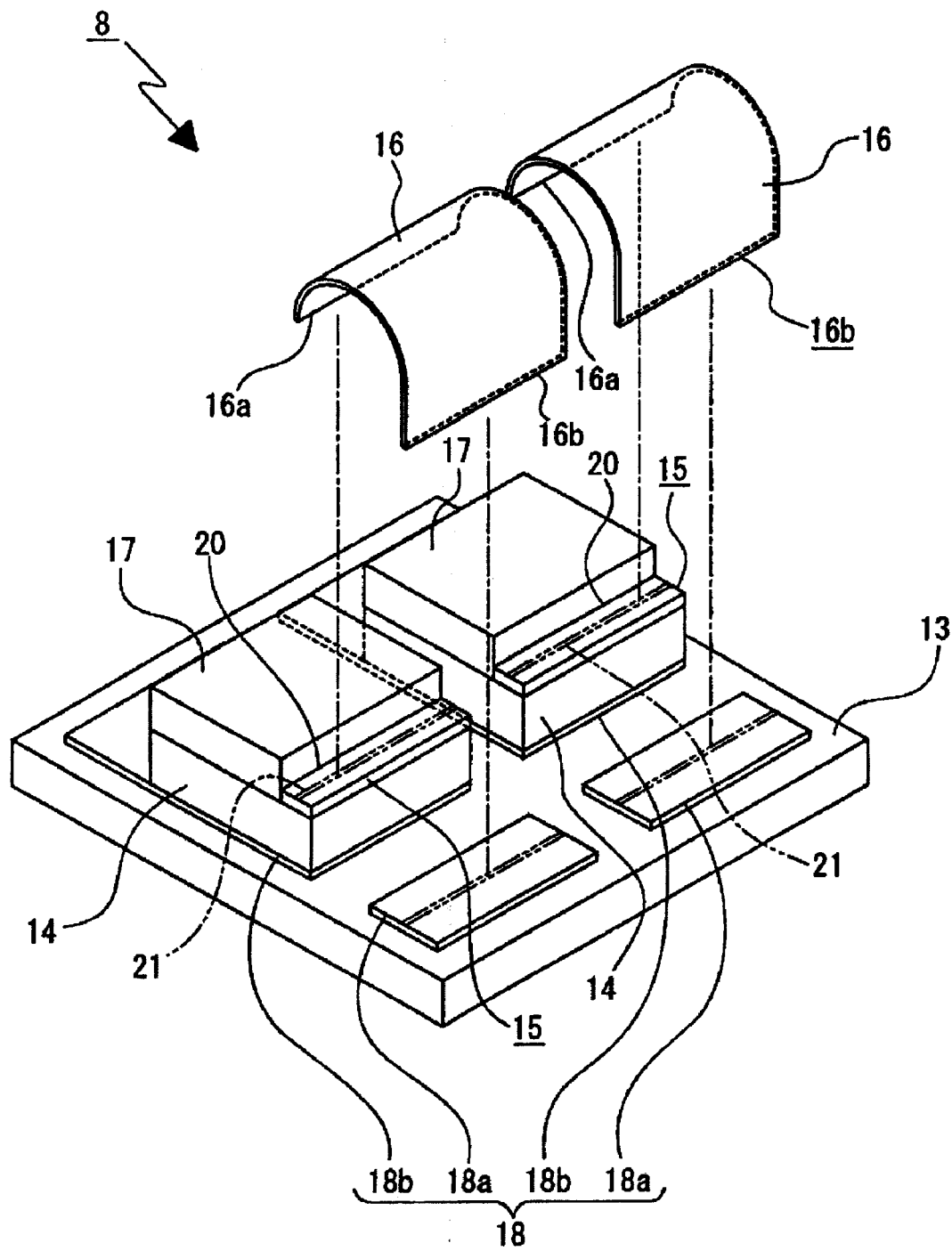
FIG. 5 is an exploded perspective view that shows an example of two light source modules positioned adjacent.

Note that the number of light source modules 8, 8A is not limited to one. For example, two modules may be used in an adjacent arrangement as illustrated in FIG. 5, although any number of modules may be arranged. Further, note that, although FIG. 5 shows an example where the connecting sheet is used as the connecting body 16, the plurality of wires 16*a*, 16*a*, . . . may also be utilized to configure the connecting body 16.

If a plurality of light source modules is arranged, then there is no need to connect the plurality of semiconductor light emitting elements to different circuit boards. As FIG. 5 shows, it is possible to connect the plurality of semiconductor light emitting elements to one circuit board 13.

Modifications of the light source modules 8, 8A will be described below. It should be noted that the modifications specified below are examples that utilize the connecting sheet as the connecting body.

Figure 6:
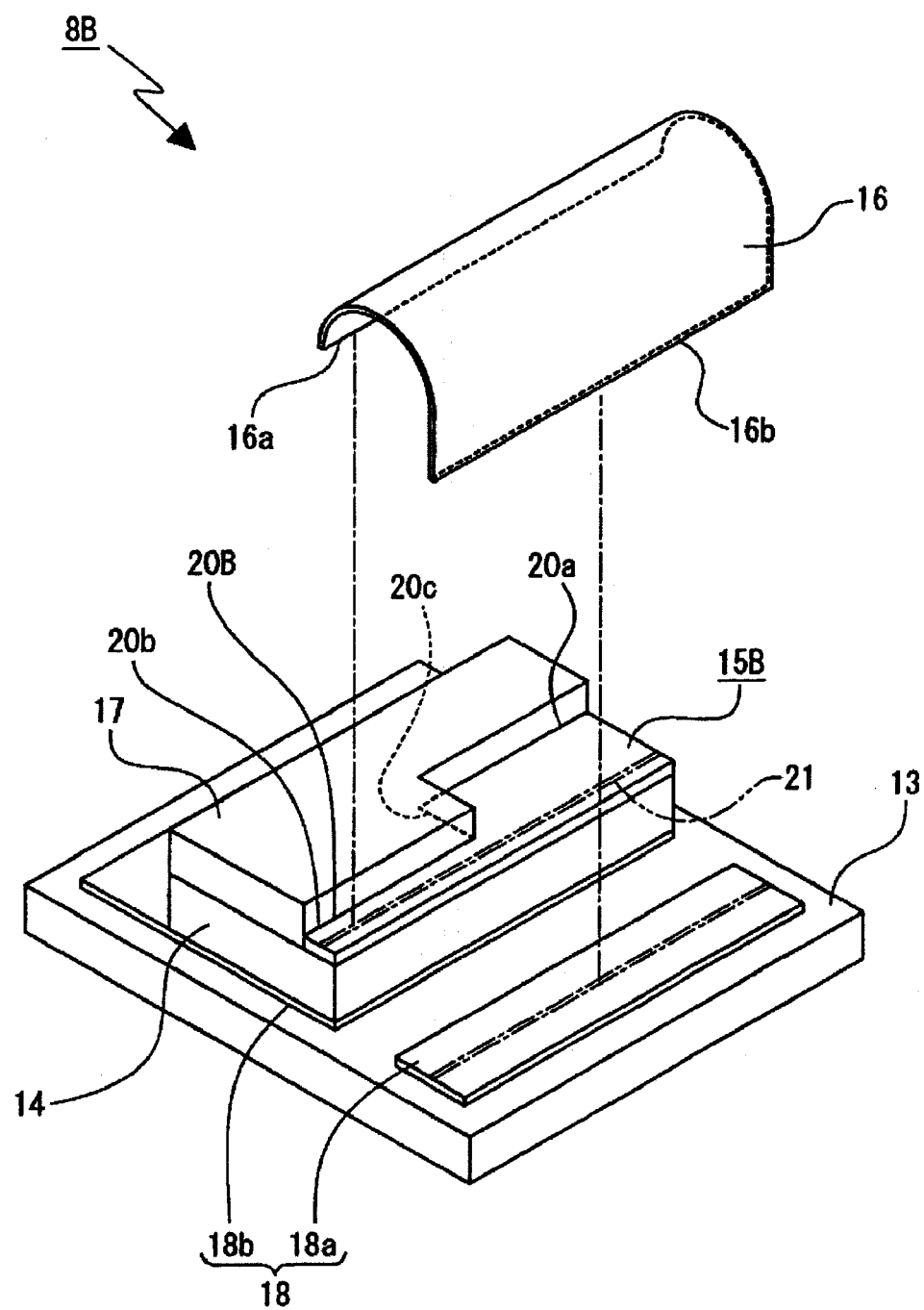
FIG. 6 is an exploded perspective view that shows a light source module according to a first modification.

As FIG. 6 shows, in a light source module 8B according to a first modification, an electrode pad 15B includes a cut-off line forming portion 20B, and the cut-off line forming portion 20B is formed so as to be divided in the lengthwise direction of the electrode pad 15B. The cut-off line forming portion 20B is configured from a first line forming portion 20*a*, a second line forming portion 20*b*, and a stepped portion 20 that is positioned there between.

The first line forming portion 20*a* and the second line forming portion 20*b* are formed at different positions in a direction orthogonal to the lengthwise direction of the electrode pad 15B.

Figure 7:
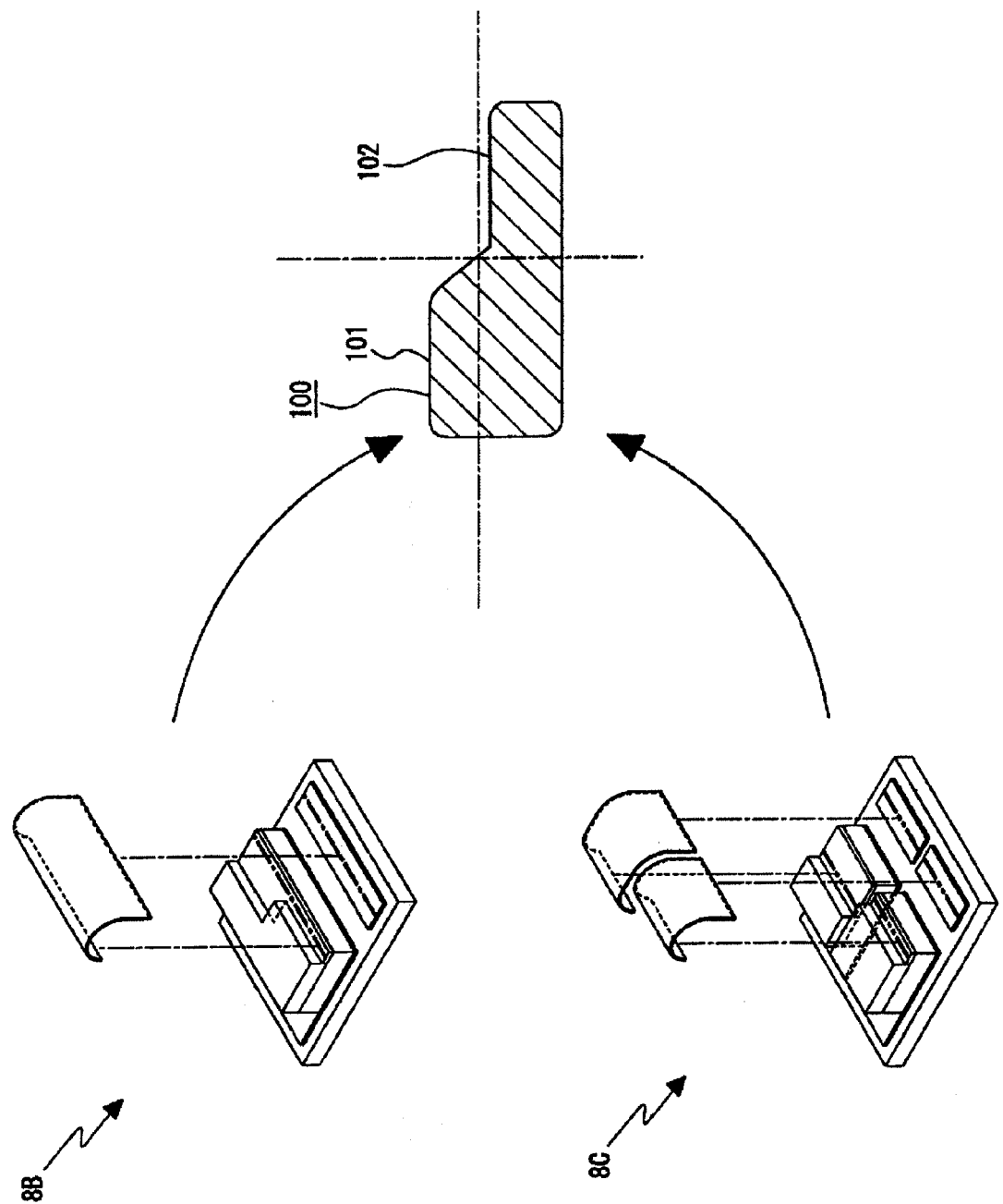
FIG. 7 is a conceptual diagram that shows a light distribution pattern generated by the light source module according to the first modification and a light source module according to a second modification.

By forming the first line forming portion 20*a* and the second line forming portion 20*b* on the electrode pad 15B as in the light source module 8B, cut-off lines 101, 102 of a light distribution pattern 100 are respectively generated by the first line forming portion 20*a* and the second line forming portion 20*b* of the electrode pad 15B, as illustrated in FIG. 7. Accordingly, a desired light distribution pattern 100 can be formed.

Figure 8:
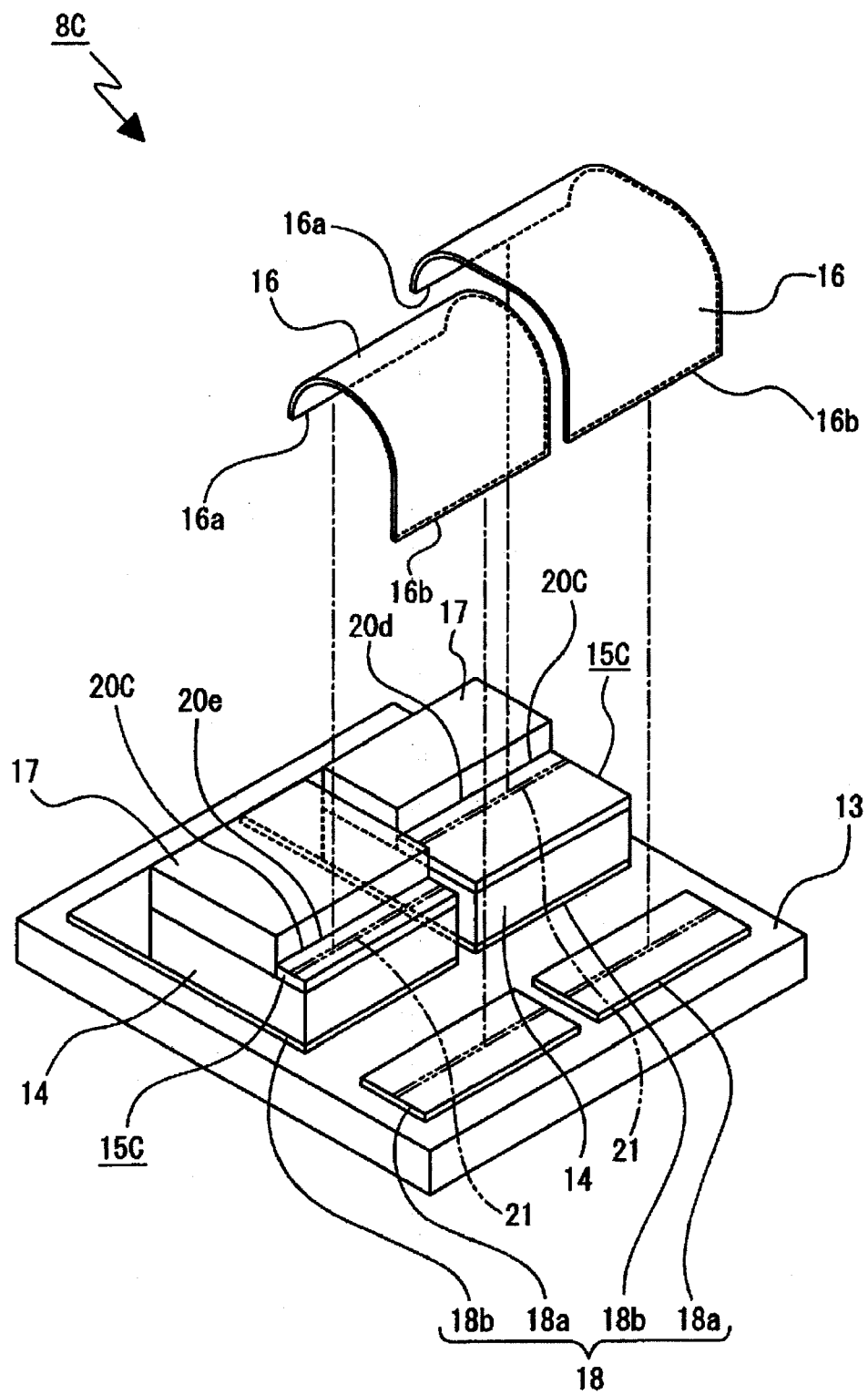
FIG. 8 is an exploded perspective view that shows the light source module according to the second modification.

As FIG. 8 shows, in a light source module 8C according to a second modification, two semiconductor light emitting elements 14, 14 are arranged adjacent, such that the positions of cut-offline forming portions 20C, 20C of electrode pads 15C, 15C differ in a direction orthogonal to the lengthwise direction of the electrode pads 15C, 15C. In other words, the position of the cut-off line forming portion 20C of one electrode pad 15C is located toward one end portion of the semiconductor light emitting element 14, and the position of the cut-off line forming portion 20C of the other electrode pad 15C is located near the center of the semiconductor light emitting element 14. The cut-off line forming portions 20C, 20C of the electrode pads 15C, 15C are formed as a first line forming portion 20c and a second line forming portion 20e, respectively.

By forming the cut-off line forming portions 20C, 20C of the electrode pads 15C, 15C at different positions as in the light source module 8C, the cut-off lines 101, 102 of the light distribution pattern 100 are respectively generated by the first line forming portion 20d and the second line forming portion 20e of the electrode pads 15C, 15C, similar to the light source module 8B. Accordingly, a desired light distribution pattern 100 can be formed.

Figure 9:
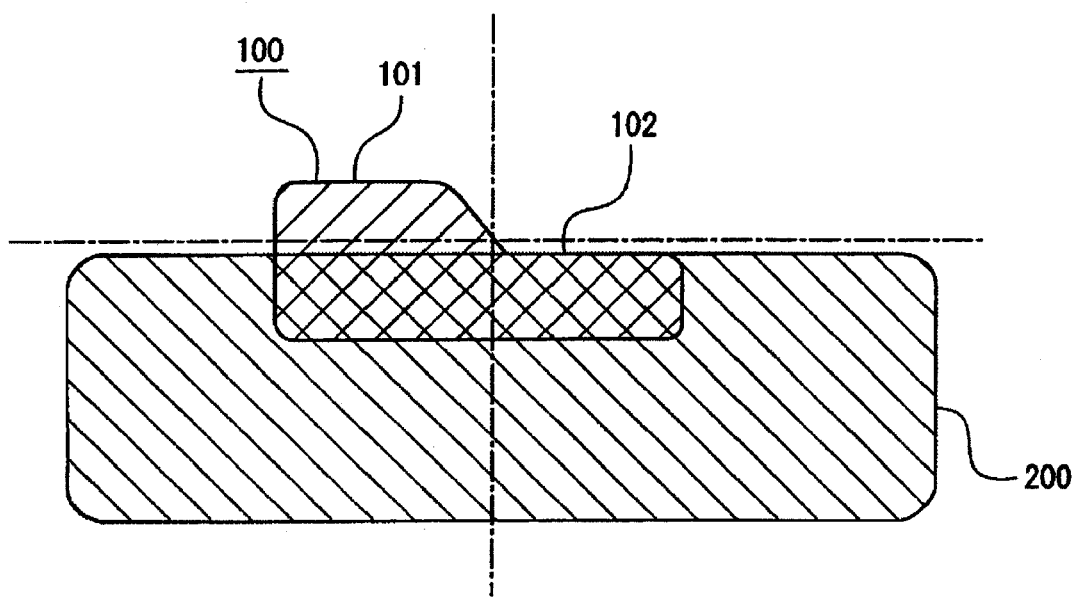
FIG. 9 is a conceptual diagram that shows light distribution patterns generated by a combination of a plurality of light source modules.

It should be noted that, the light source module 8B or the light source module 8C may be used as the light source module configuring the first lamp unit 10 shown in FIG. 1, and the light source module 8 or the light source module 8A may be used as the light source module configuring the second lamp unit 12. In such case, as illustrated in FIG. 9, the light distribution pattern 100 can be generated by the light source module 8B or the light source module 8C, and a generally oblong light distribution pattern 200 can be generated by the light source module 8 or the light source module 8A. Accordingly, a desired light distribution pattern can be formed by using the light source modules 8, 8A, 8B, 8C in combination as appropriate.

As described above, in the vehicular lamp 1, the electrode pad 15 (15B, 15C) is provided on at least one end portion of the semiconductor light emitting element 14, and the connecting portion 21 of the electrode pad 15 (15B, 15C) is provided at a position in a continuous or spaced manner in the lengthwise direction of the electrode pad 15 (15B, 15C). Therefore, the connection area with the connecting body 16 is large, which leads to improved heat radiation performance. Furthermore, a large amount of power can be supplied to the semiconductor light emitting element 14, which makes it possible to improve brightness by securing a sufficient amount of luminous flux from light emitted from the semiconductor light emitting element 14.

Using the connecting sheet formed by a metallic material as the connecting body 16 can secure a sufficient connection area between the connecting body 16 and the electrode pad 15, thereby improving brightness.

Furthermore, the cut-off line forming portion 20 (20B, 20C) is formed on the electrode pad 15 to form cut-off lines for the light distribution patterns 100, 200, which thus eliminates the need for a light-blocking member such as a shade in order to generate the light distribution patterns 100, 200. This reduction in the number of parts can also lower manufacturing costs.

The shapes and structures of the respective portions in the above embodiments are merely examples for carrying out the present invention.

Accordingly, while description has been made in connection with exemplary embodiments of the present invention, it will be obvious to those skilled in the art that various changes and modification may be made therein without departing from the present invention. It is aimed, therefore, to cover in the appended claims all such changes and modifications falling within the true spirit and scope of the present invention.

[Description of the Reference Numerals]

| | |
|---|---|
| 1 | VEHICULAR LAMP |
| 4 | LAMP SPACE |
| 8 | LIGHT SOURCE MODULE |
| 13 | CIRCUIT BOARD |
| 14 | SEMICONDUCTOR LIGHT EMITTING ELEMENT |
| 14a | FIRST SURFACE |
| 14b | SECOND SURFACE |
| 15 | ELECTRODE PAD |
| 16 | CONNECTING BODY |
| 18 | CIRCUIT PATTERN |
| 18a | FIRST PART |
| 18b | SECOND PART |
| 20 | CUT-OFF LINE FORMING PORTION |
| 21 | CONNECTING PORTION |
| 8A | LIGHT SOURCE MODULE |
| 8B | LIGHT SOURCE MODULE |
| 15B | ELECTRODE PAD |
| 20B | CUT-OFF LINE FORMING PORTION |
| 20a | FIRST LINE FORMING PORTION |
| 20b | SECOND LINE FORMING PORTION |
| 8C | LIGHT SOURCE MODULE |
| 15C | ELECTRODE PAD |
| 20C | CUT-OFF LINE FORMING PORTION |
| 20d | FIRST LINE FORMING PORTION |
| 20e | SECOND LINE FORMING PORTION |
| 100 | LIGHT DISTRIBUTION PATTERN |
| 101 | CUT-OFF LINE |
| 102 | CUT-OFF LINE |
| 200 | LIGHT DISTRIBUTION PATTERN |

What is claimed is:

1. A light source module comprising:
   a circuit board on which a circuit pattern is formed, the circuit pattern comprising a first part and a second part;
   a semiconductor light emitting element comprising a first surface formed in an oblong shape, and a second surface positioned facing opposite the first surface, wherein the second surface is connected with the second part of the circuit pattern;
   an electrode pad provided on the first surface of the semiconductor light emitting element and comprising a connecting portion; and
   a connecting body connected with the connecting portion of the electrode pad and the first part of the circuit pattern,
   wherein the electrode pad is provided on a portion of the semiconductor light emitting element that includes one end portion of the first surface,
   wherein the connecting portion of the electrode pad is provided at a position in one of a continuous and spaced manner in a lengthwise direction of the electrode pad, and
   wherein a side edge extending in the lengthwise direction of the electrode pad is formed as a cut-off line forming portion that forms a cut-off line of a light distribution pattern generated by light emitted from the semiconductor light emitting element.

2. The light source module according to claim 1, wherein the connecting body comprises a connecting sheet formed by a metallic material, and wherein one end portion of the connecting sheet is connected with the connecting portion of the electrode pad.

3. The light source module according to claim 1, wherein the cut-off line forming portion of the electrode pad is divided in two in the lengthwise direction so as to form a first line forming portion and a second line forming portion, respectively, and wherein the first line forming portion and the second line forming portion are formed at different positions in a direction orthogonal to the lengthwise direction of the electrode pad.

4. The light source module according to claim 1, wherein the connecting body comprises a plurality of wires, and wherein one end of each of the plurality of wires is connected with the connecting portion of the electrode pad.

5. The light source module according to claim 1 further comprising: a phosphor layer disposed on the semiconductor light emitting element, wherein light emitted from the semiconductor light emitting element is radiated as white light due to the phosphor layer.

6. A vehicular lamp comprising:
a light source module disposed in a lamp space; and
an optical member that performs a predetermined function with respect to light emitted from the light source module;
wherein the light source module comprises:
a circuit board on which a circuit pattern is formed, the circuit pattern comprising a first part and a second part;
a semiconductor light emitting element comprising: a first surface formed into an oblong shape, and a second surface positioned facing opposite the first surface, wherein the second surface is connected with the second part of the circuit pattern;
an electrode pad provided on the first surface of the semiconductor light emitting element and comprising a connecting portion; and
a connecting body connected with the connecting portion of the electrode pad and the first part of the circuit pattern,
wherein the electrode pad is provided on a portion of the semiconductor light emitting element that includes one end portion of the first surface, and the connecting portion of the electrode pad is provided at a position in one of a continuous and spaced manner in a lengthwise direction of the electrode pad, and
wherein a side edge extending in the lengthwise direction of the electrode pad is formed as a cut-off line forming portion that forms a cut-off line of a light distribution pattern generated by light emitted from the semiconductor light emitting element.

7. The vehicular lamp according to claim 6, wherein the connecting body comprises a connecting sheet formed by a metallic material, and wherein one end portion of the connecting sheet is connected with the connecting portion of the electrode pad.

8. The vehicular lamp according to claim 6, wherein the cut-off line forming portion of the electrode pad is divided in two in the lengthwise direction so as to form a first line forming portion and a second line forming portion, respectively, and wherein the first line forming portion and the second line forming portion are formed at different positions in a direction orthogonal to the lengthwise direction of the electrode pad.

9. The vehicular lamp according to claim 6, wherein the connecting body comprises a plurality of wires, and wherein one end of each of the plurality of wires is connected with the connecting portion of the electrode pad.

10. The vehicular lamp according to claim 6 further comprising: a phosphor layer disposed on the semiconductor light emitting element, wherein light emitted from the semiconductor light emitting element is radiated as white light due to the phosphor layer.

11. A vehicular lamp comprising:
a light source module disposed in a lamp space; and
an optical member that performs a predetermined function with respect to light emitted from the light source module;
wherein the light source module comprises:
a circuit board on which a circuit pattern is formed, the circuit pattern comprising a first part and a second part;
a semiconductor light emitting element comprising: a first surface formed into an oblong shape, and a second surface positioned facing opposite the first surface, wherein the second surface is connected with the second part of the circuit pattern;
a phosphor layer disposed on the semiconductor light emitting element, wherein light emitted from the semiconductor light emitting element is radiated as white light due to the phosphor layer;
an electrode pad provided on the first surface of the semiconductor light emitting element and comprising a connecting portion; and
a connecting body connected with the connecting portion of the electrode pad and the first part of the circuit pattern,
wherein the electrode pad is provided on a portion of the semiconductor light emitting element that includes one end portion of the first surface,
wherein the connecting portion of the electrode pad is provided at a position in one of a continuous and spaced manner in a lengthwise direction of the electrode pad,
wherein the connecting body comprises a connecting sheet formed by a metallic material,
wherein one end portion of the connecting sheet is connected with the connecting portion of the electrode pad,
wherein a side edge extending in the lengthwise direction of the electrode pad is formed as a cut-off line forming portion that forms a cut-off line of a light distribution pattern generated by light emitted from the semiconductor light emitting element,
wherein the cut-off line forming portion of the electrode pad is divided in two in the lengthwise direction so as to form a first line forming portion and a second line forming portion, respectively, and
wherein the first line forming portion and the second line forming portion are formed at different positions in a direction orthogonal to the lengthwise direction of the electrode pad.

* * * * *